United States Patent
Syue et al.

(10) Patent No.: US 9,945,048 B2
(45) Date of Patent: Apr. 17, 2018

(54) SEMICONDUCTOR STRUCTURE AND METHOD

(75) Inventors: Sen-Hong Syue, Hsin-Chu (TW); Pu-Fang Chen, Hsin-Chu (TW); Shiang-Bau Wang, Pingzchen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/525,041

(22) Filed: Jun. 15, 2012

(65) Prior Publication Data

US 2013/0337631 A1    Dec. 19, 2013

(51) Int. Cl.
*C30B 15/04* (2006.01)
*H01L 21/02* (2006.01)
(Continued)

(52) U.S. Cl.
CPC ............ *C30B 15/04* (2013.01); *C30B 15/203* (2013.01); *C30B 15/206* (2013.01); *C30B 15/22* (2013.01);
(Continued)

(58) Field of Classification Search
CPC ............ H01L 21/322; H01L 21/02337; H01L 21/3105; H01L 21/76224; H01L 21/3225; H01L 29/78; H01L 21/0201; H01L 21/31053; H01L 21/311; H01L 29/365; C30B 15/00; C30B 29/06; C30B 15/04; C30B 31/02; C30B 31/04; C30B 31/165;
(Continued)

(56) References Cited

U.S. PATENT DOCUMENTS 2,809,165 A * 10/1957 Jenny ............... C30B 13/10
148/33
3,240,568 A * 3/1966 Derby ............. C30B 11/002
117/223

(Continued)

FOREIGN PATENT DOCUMENTS

CN       1545725 A    11/2004
CN     102420164 A     4/2012
(Continued)

OTHER PUBLICATIONS

Guide to conversion factors for interstitial oxygen in silicon, SEMI.*

(Continued)

*Primary Examiner* — Sophia Nguyen
(74) *Attorney, Agent, or Firm* — Slater Matsil, LLP

(57) ABSTRACT

A system and method for providing support to semiconductor wafer is provided. An embodiment comprises introducing a vacancy enhancing material during the formation of a semiconductor ingot prior to the semiconductor wafer being separated from the semiconductor ingot. The vacancy enhancing material forms vacancies at a high density within the semiconductor ingot, and the vacancies form bulk micro defects within the semiconductor wafer during high temperature processes such as annealing. These bulk micro defects help to provide support and strengthen the semiconductor wafer during subsequent processing and helps to reduce or eliminate a fingerprint overlay that may otherwise occur.

7 Claims, 6 Drawing Sheets

(51) Int. Cl.

| | | |
|---|---|---|
| *C30B 15/20* | (2006.01) | |
| *C30B 31/02* | (2006.01) | |
| *C30B 31/04* | (2006.01) | |
| *H01L 21/311* | (2006.01) | |
| *C30B 15/22* | (2006.01) | |
| *H01L 29/36* | (2006.01) | |
| *H01L 21/762* | (2006.01) | |
| *C30B 31/16* | (2006.01) | |
| *H01L 21/3105* | (2006.01) | |
| *C30B 29/06* | (2006.01) | |
| *H01L 21/322* | (2006.01) | |
| *C30B 15/00* | (2006.01) | |
| *C30B 33/00* | (2006.01) | |
| *H01L 29/78* | (2006.01) | |

(52) U.S. Cl.
CPC ............. *C30B 29/06* (2013.01); *C30B 31/02* (2013.01); *C30B 31/04* (2013.01); *C30B 31/165* (2013.01); *H01L 21/0201* (2013.01); *H01L 21/311* (2013.01); *H01L 21/31053* (2013.01); *H01L 21/3225* (2013.01); *H01L 21/76224* (2013.01); *H01L 29/365* (2013.01); *C30B 15/00* (2013.01); *C30B 33/00* (2013.01); *H01L 29/78* (2013.01)

(58) Field of Classification Search
CPC ..... C30B 33/00; C30B 15/203; C30B 15/206; C30B 15/22; C30B 33/02
USPC ................ 438/218, 424, 501, 795; 257/617, 257/E21.546; 117/19
See application file for complete search history.

(56) References Cited

U.S. PATENT DOCUMENTS

| | | | | |
|---|---|---|---|---|
| 3,481,711 A * | 12/1969 | Maruyama | ................ | C22F 1/00 117/202 |
| 3,520,810 A * | 7/1970 | Plaskett | .................. | C30B 11/14 117/82 |
| 3,533,967 A * | 10/1970 | High | ....................... | C30B 11/00 117/77 |
| 3,596,148 A * | 7/1971 | McNeely | ..................... | C30B 11/00 257/6 |
| 3,755,752 A * | 8/1973 | Kim | ........................ | H01L 23/36 257/6 |
| 4,303,464 A * | 12/1981 | Suzuki et al. | .................. | 117/17 |
| 4,911,780 A * | 3/1990 | Morioka et al. | ................ | 117/18 |
| 5,032,539 A * | 7/1991 | Watanabe | ........... | H01L 33/0062 148/DIG. 66 |
| 5,126,113 A | 6/1992 | Yamagishi et al. | | |
| 5,324,488 A | 6/1994 | Klingshirn et al. | | |
| 5,478,762 A * | 12/1995 | Chao | ......................... | 438/143 |
| 5,487,355 A | 1/1996 | Chiou et al. | | |
| 5,493,985 A * | 2/1996 | Bliss | ........................ | C30B 29/40 117/33 |
| 5,788,763 A * | 8/1998 | Hayashi | ................. | C30B 15/206 117/2 |
| 5,820,672 A | 10/1998 | Bell et al. | | |
| 6,146,459 A | 11/2000 | Park | | |
| 6,222,252 B1 * | 4/2001 | Numano et al. | ............ | 257/617 |
| 6,297,091 B1 * | 10/2001 | Roh | ................... | H01L 27/10888 257/E21.649 |
| 6,365,461 B1 * | 4/2002 | Asayama | ............. | C30B 29/06 117/84 |
| 6,478,883 B1 * | 11/2002 | Tamatsuka | .............. | C30B 15/00 117/20 |
| 6,548,886 B1 * | 4/2003 | Ikari et al. | ..................... | 257/610 |
| 6,777,336 B2 * | 8/2004 | Lin | ................... | H01L 21/31053 257/E21.244 |
| 7,071,079 B2 | 7/2006 | Tobe | | |
| 7,144,829 B2 * | 12/2006 | Yoneda | ........................ | 438/795 |
| 7,947,551 B1 * | 5/2011 | Syue | ................ | H01L 21/02274 257/374 |
| 8,771,560 B2 * | 7/2014 | Kretzer et al. | ............. | 252/521.3 |
| 2001/0029883 A1 * | 10/2001 | Minami | .................. | C30B 29/06 117/20 |
| 2001/0055689 A1 * | 12/2001 | Park | ........................ | C30B 15/14 428/446 |
| 2002/0020339 A1 * | 2/2002 | Holder | .......................... | 117/19 |
| 2002/0081817 A1 * | 6/2002 | Bhakta | .................. | H01L 21/76224 438/424 |
| 2002/0187566 A1 * | 12/2002 | Kim, II | ............... | H01L 21/3225 438/10 |
| 2003/0008447 A1 * | 1/2003 | Asayama et al. | ............. | 438/200 |
| 2003/0008479 A1 * | 1/2003 | Chen et al. | ..................... | 438/474 |
| 2003/0079674 A1 | 5/2003 | Tachikawa et al. | | |
| 2003/0157814 A1 * | 8/2003 | Iida | ........................ | H01L 21/324 438/795 |
| 2004/0003769 A1 * | 1/2004 | Tamatsuka | .............. | C30B 29/06 117/13 |
| 2004/0009111 A1 * | 1/2004 | Haga | .................... | C30B 15/203 423/328.2 |
| 2004/0102056 A1 * | 5/2004 | Tobe et al. | .................... | 438/795 |
| 2004/0192071 A1 * | 9/2004 | Kobayashi | .............. | C30B 29/06 438/795 |
| 2005/0124123 A1 * | 6/2005 | Itani | ................... | H01L 21/26533 438/300 |
| 2005/0130452 A1 * | 6/2005 | Nakada et al. | ............... | 438/795 |
| 2005/0151183 A1 * | 7/2005 | Tu | ..................... | H01L 21/31144 257/301 |
| 2005/0227452 A1 * | 10/2005 | Ohashi | ............. | H01L 21/28185 438/425 |
| 2006/0060129 A1 * | 3/2006 | Hirano | .................... | C30B 29/06 117/20 |
| 2006/0121291 A1 * | 6/2006 | Hayamizu | ........... | H01L 21/3225 428/446 |
| 2006/0150894 A1 * | 7/2006 | Kobayashi | ........................ | 117/84 |
| 2006/0189169 A1 * | 8/2006 | Adachi | ............... | H01L 21/3225 438/795 |
| 2006/0213427 A1 * | 9/2006 | Sugawara | ............... | C30B 11/00 117/81 |
| 2007/0095274 A1 * | 5/2007 | Sugimura et al. | ................ | 117/2 |
| 2007/0157870 A1 * | 7/2007 | Hourai et al. | .................. | 117/13 |
| 2007/0218570 A1 * | 9/2007 | Nakamura et al. | ............... | 438/5 |
| 2007/0252239 A1 * | 11/2007 | Maeda et al. | ................... | 257/607 |
| 2008/0014710 A1 * | 1/2008 | Bian et al. | ..................... | 438/424 |
| 2008/0160721 A1 * | 7/2008 | Eun | ................... | H01L 21/76224 438/435 |
| 2009/0051013 A1 * | 2/2009 | Schulze | ........................ | 257/629 |
| 2009/0081856 A1 * | 3/2009 | Umeno | ........................ | 438/501 |
| 2009/0092535 A1 * | 4/2009 | Nichol | .................. | C01B 33/037 423/350 |
| 2009/0169460 A1 * | 7/2009 | Song | .................. | C30B 15/305 423/349 |
| 2009/0224366 A1 * | 9/2009 | von Ammon | ............ | C30B 29/06 257/607 |
| 2009/0242843 A1 * | 10/2009 | Ebara | ........................ | 252/500 |
| 2010/0022068 A1 * | 1/2010 | Chen et al. | ..................... | 438/424 |
| 2010/0038757 A1 * | 2/2010 | Isogai et al. | ..................... | 257/655 |
| 2010/0078767 A1 * | 4/2010 | Park | .................... | H01L 21/2253 257/617 |
| 2010/0155903 A1 * | 6/2010 | Ishisaka | ................ | C30B 15/02 257/617 |
| 2010/0164071 A1 * | 7/2010 | Nakai et al. | ..................... | 257/617 |
| 2010/0323494 A1 * | 12/2010 | Liao et al. | ..................... | 438/423 |
| 2011/0156215 A1 * | 6/2011 | Nakai | ........................ | 257/617 |
| 2011/0197809 A1 * | 8/2011 | Cho et al. | ..................... | 117/204 |
| 2011/0217225 A1 * | 9/2011 | Schmid | .................. | C01B 33/037 423/350 |
| 2011/0312183 A1 * | 12/2011 | Yi et al. | ........................ | 438/694 |
| 2012/0001301 A1 * | 1/2012 | Ebara et al. | ..................... | 257/617 |
| 2012/0052457 A1 * | 3/2012 | Saito | .................... | C23C 16/46 432/206 |
| 2012/0112135 A1 * | 5/2012 | Sakurada et al. | ................ | 252/512 |
| 2012/0126171 A1 * | 5/2012 | Andreaco | ................ | C30B 15/02 252/301.4 F |
| 2012/0178240 A1 * | 7/2012 | Sucher | ............... | H01L 21/3225 438/471 |

(56) References Cited

U.S. PATENT DOCUMENTS

| | | | |
|---|---|---|---|
| 2012/0241912 A1* | 9/2012 | Senda | H01L 21/0201 257/617 |
| 2012/0292735 A1* | 11/2012 | Tan | H01L 21/76232 257/506 |
| 2013/0032912 A1* | 2/2013 | Chen | H01L 27/1463 257/431 |
| 2013/0049134 A1* | 2/2013 | Sunamura | H01L 21/823842 257/392 |
| 2013/0175665 A1* | 7/2013 | Chudzik | H01L 21/02181 257/532 |
| 2013/0192303 A1* | 8/2013 | Ryu et al. | 65/29.12 |
| 2014/0064885 A1* | 3/2014 | Oyama | H01L 21/67373 414/160 |
| 2014/0170843 A1* | 6/2014 | Chen | H01L 27/11573 438/586 |
| 2014/0361408 A1* | 12/2014 | Falster et al. | 257/607 |

FOREIGN PATENT DOCUMENTS

| | | | |
|---|---|---|---|
| DE | 60209064 | | 7/2006 |
| JP | 04006196 A | * | 1/1992 |
| TW | 480563 A | * | 3/2002 |

OTHER PUBLICATIONS

Yu et al., Grown-in defects in nitrogen-doped Czochralski silicon, 2002, Journal of Applied Physics vol. 92, No. 1, 188-194.*

Abdumalik et al., Fluorine-vacancy complexes in ultrashallow B-implanted SI, Applied Physics Letters 89, 052114 (2006).*

Simpson et al., Observation of fluorine-vacancy complexes in silicon, Applied Physics Letters 85, 1538 (2004).*

Milind S. Kulkarni, "Defect Dynamics in the Presence of Nitrogen in Growing Czochralski Silicon Crystals," Journal of Crystal Growth 310 (2008), Oct. 13, 2007, ScienceDirect, pp. 324-335.

* cited by examiner

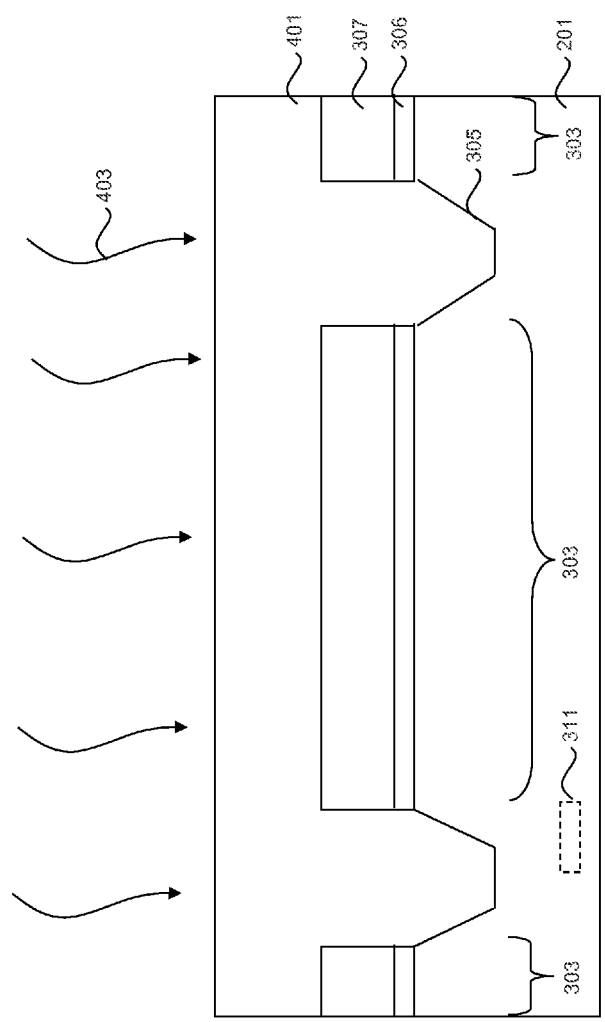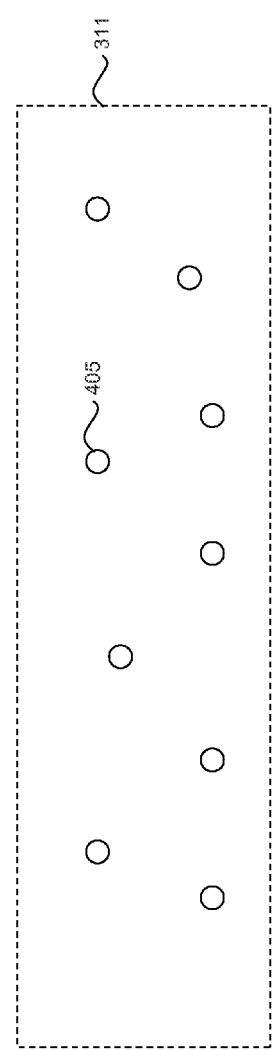

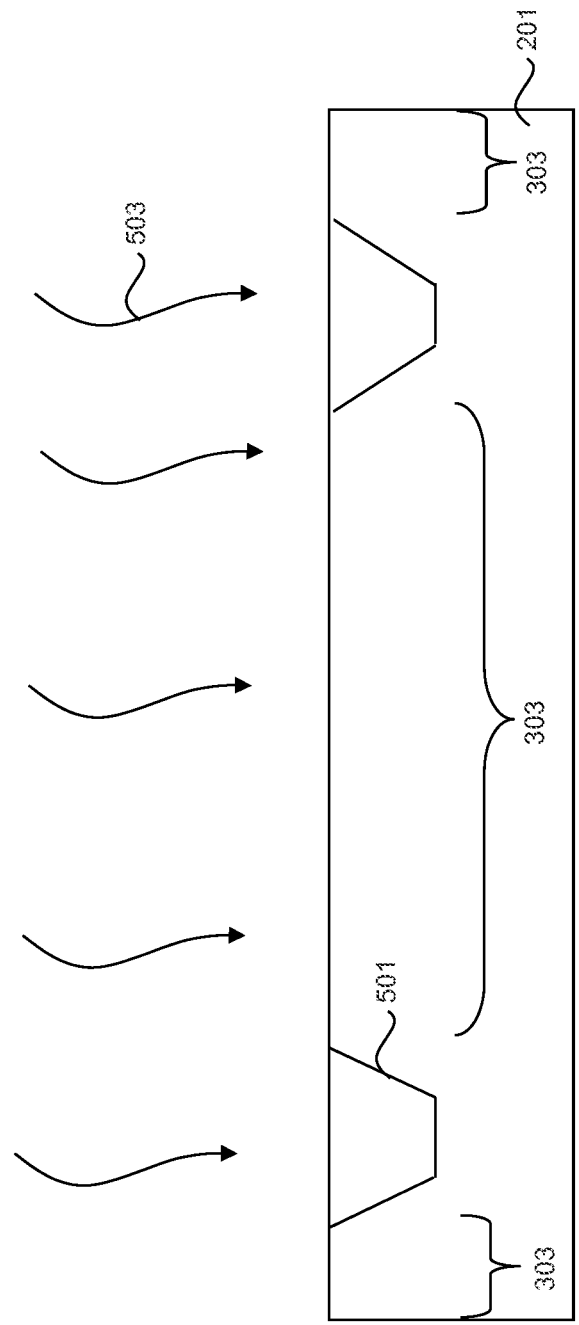

SEMICONDUCTOR STRUCTURE AND METHOD

BACKGROUND

Generally, integrated circuits may be formed from a plurality of semiconductor devices within a semiconductor die. As a starting point for this process, the semiconductor devices may be formed through a series of manufacturing steps including oxidation, implantation, deposition, photolithography, etching, annealing, chemical mechanical polishing. Once the semiconductor devices have been formed, a series of conductive and dielectric layers may be deposited or otherwise formed over the semiconductor devices in order to connect the individual devices to each other and also to provide a connection between the individual devices and external devices so that the integrated circuit may be integrated for use by a consumer.

However, as the integrated circuits and their associated semiconductor devices are scaled down to smaller and smaller sizes in the rush of miniaturization, issues have arisen at all levels of production. Such issues have included everything from achieving heightened precision in photo-lithographic masks to ensuring that an adequate coverage occurs in high-aspect ratio vias during a deposition process. At each level of miniaturization, these issues have needed to be addressed in order for the miniaturization to continue to meet the demands for consumer products.

One such issue that may occur as devices are scaled down beyond the twenty nanometer process node is defects that can occur in the semiconductor wafer onto which the various semiconductor devices, conductive, and dielectric layers are formed in order to make the integrated circuit. In particular, semiconductor wafers have a tendency to warp or deflect during high temperature processes. At smaller and smaller processing nodes, even minor warping or deflecting of the semiconductor wafer can lead to misalignments as the various manufacturing processes are performed on the semiconductor wafer.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 4A-4B illustrate a filling of the trenches and a first anneal in accordance with an embodiment;

FIG. 5 illustrates a planarization and a second anneal in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a manufacturing process for reducing fingerprints during the manufacturing of semiconductor devices on semiconductor wafers at a twenty nanometer process node or less. Other embodiments may also be applied, however, to other manufacturing processes.

Figure 1:
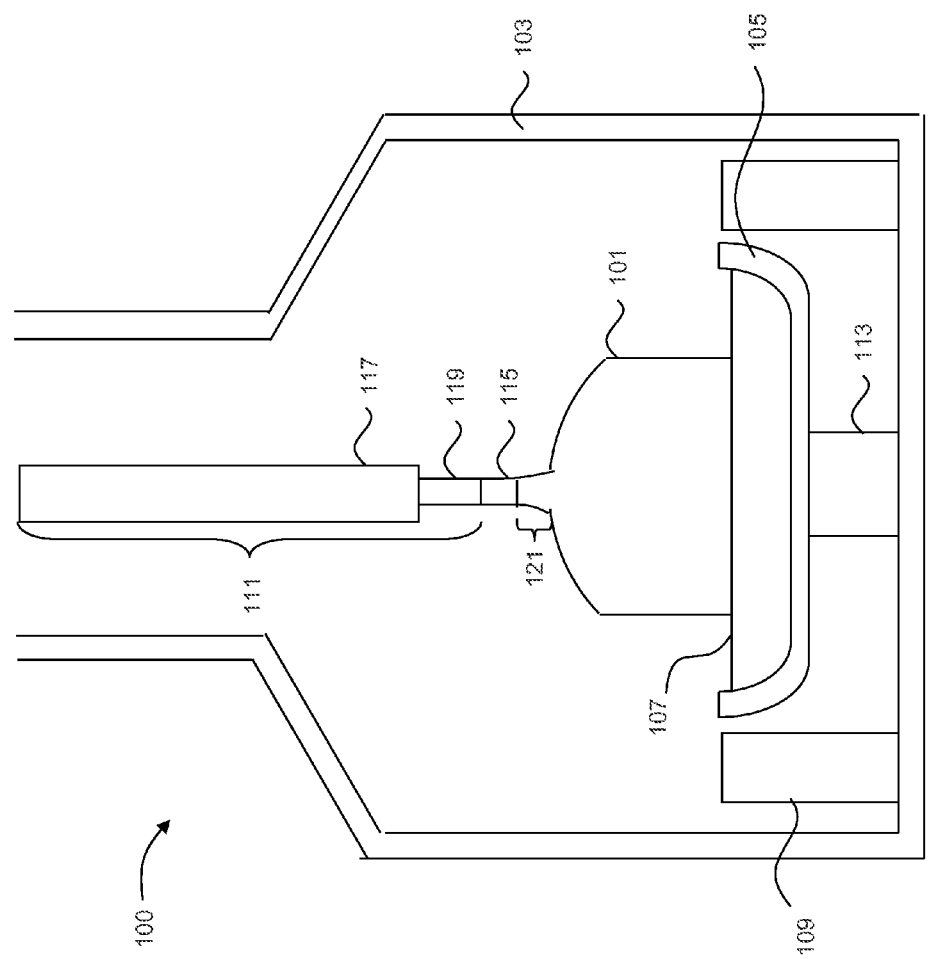
FIG. 1 illustrates a semiconductor pulling apparatus in accordance with an embodiment.

With reference now to FIG. 1, there is shown an apparatus 100 for forming a semiconductor ingot 101. In an embodiment the apparatus 100 may be utilized to form the semiconductor ingot 101 in a Czochralski crystal growth process, in which atoms of a semiconductor material (e.g., silicon) solidify and crystallize along a liquid interface as the semiconductor ingot 101 is pulled from a semiconductor melt 107. However, as one of ordinary skill in the art will recognize, while the Czochralski process is described herein, the embodiments are not intended to be limited to the Czochralski process, as the embodiments may be utilized in a wide variety of crystal growth processes.

The apparatus 100 may comprise an external housing 103, a crucible 105 to hold a semiconductor melt 107, heating elements 109, and a pulling device 111. The external housing 103 may comprise a heat resistant material, such as quartz, silicon carbide, combinations of these, or the like, and provide an interior chamber for the crucible 105 and the heating elements 109 to reside. The external housing 103 may also provide an inlet and an outlet (not individually illustrated in FIG. 1) in which a protective and non-reactive gas such as argon may be flowed into an out of the external housing 103.

The crucible 105 may be used to melt raw materials (described in more detail below) and retain the semiconductor melt 107 while the semiconductor ingot 101 is pulled from the semiconductor melt 107 out of the crucible 105. The crucible 105 may be formed from a material that won't significantly pollute or otherwise contaminate the semiconductor melt 107 while also being able to withstand the heat from the heating elements 109 used to form and maintain the semiconductor melt 107. In an embodiment the crucible 105 may be quartz, although any other suitable material may alternatively be utilized. The crucible 105 may have, e.g., a depth of less than about 200 mm and a diameter of between about 400 mm and about 1,000 mm, although any other suitable dimensions may alternatively be utilized depending in part on the size of the semiconductor ingot 101 desired.

The crucible 105 may be located on a rotatable shaft 113. The rotatable shaft 113 may be utilized to rotate the crucible 105 as the semiconductor ingot 101 is being pulled from the semiconductor melt 107. In an embodiment the rotatable shaft 113 provides a rotation that is opposite the rotation provided by the pulling device 111 (described further below) during the pulling of the semiconductor ingot 101 from the semiconductor melt 107.

The heating elements 109 may be located within thermal proximity to the crucible 105. The heating elements 109 may be placed so as to be able to heat the crucible 105 and the interior of the crucible 105 to a desired temperature, such as a temperature to melt the raw materials and form the semiconductor melt 107. The heating elements 109 may be resistive heaters, graphite heaters, radiative heaters, high frequency heaters, combinations of these, or the like, although any suitable method of providing heat to the crucible 105 may alternatively be utilized.

The pulling device 111 may be located above the crucible 105 and is utilized to lower and raise a seed crystal 115 into and out of the semiconductor melt 107 in the crucible 105. In an embodiment the pulling device 111 may comprise a pulling shaft 117 and a seed holder 119 utilized to hold and support the seed crystal 115. The pulling shaft 117 may be used to provide support and movement to the seed holder 119, the seed crystal 115, and the semiconductor ingot 101 as the semiconductor ingot 101 is being formed. Additionally, the pulling shaft 117 may be utilized to impart a rotation to the seed crystal 115 and the semiconductor ingot 101 during the process. The rotation provided by the pulling device 111 may be opposite the rotation provided by the rotatable shaft 113 and the crucible 105.

To initiate the process of forming the semiconductor ingot 101, one or more raw materials (not individually illustrated in FIG. 1) may be loaded into the crucible 105. In an embodiment, these raw materials may be loaded generally as solid materials. In an embodiment in which a silicon ingot is desired, the raw material for the supplying of semiconductor materials (e.g., silicon) may be, e.g., a solid polycrystalline silicon material. However, other suitable materials may be utilized to form any desired crystal.

Optionally, if it is desired to dope the semiconductor ingot 101, raw materials that will supply a dopant concentration to the semiconductor melt 107 may also be supplied. For example, in an embodiment in which the semiconductor ingot 101 is desired to be doped with p-type dopants, a silicon alloy that has already been previously doped with the desired impurity, such as boron, may be added to the crucible 105. Alternatively, if the semiconductor ingot 101 is desired to be doped with an n-type dopant, a silicon alloy that has already been previously doped with an n-type dopant, such as phosphorous, may be added to the crucible 105. However, any other suitable method of supplying the desired dopants to the crucible 105 for their incorporation into the semiconductor ingot 101 may alternatively be used.

In addition to the raw materials for the semiconductor itself and the dopants to be included within the semiconductor material, an additional vacancy enhancing material may also be loaded into the crucible 105 for incorporation into the semiconductor melt 107. By loading the vacancy enhancing material into the crucible 105 along with the other raw materials, the vacancy enhancing material may be incorporated into the semiconductor ingot 101 as the semiconductor ingot 101 is being pulled. As the vacancy enhancing material is incorporated into the semiconductor ingot 101, the vacancy enhancing material will generate or enhance a high vacancy concentration within the semiconductor ingot 101 as it is being grown. For example, the vacancy concentration of the semiconductor ingot 101 as it is being pulled may be between about 1E10 #/cm$^3$ and about 1E15 #/cm$^3$, such as about 1E11 #/cm$^3$.

In an embodiment the vacancy enhancing material may be, e.g., nitrogen, although other suitable materials, such as sulfur, carbon, fluorine, chlorine, or phosphorus, combinations of these, or the like, may alternatively be utilized. In an embodiment in which the vacancy enhancing material is nitrogen, the vacancy enhancing material may be introduced into the crucible 105 by adding a nitride such as $Si_xN_y$ (e.g., $Si_3N_4$, although the precise ratio of x and y depends on the method of formation deposition of the $Si_xN_y$), SiON, or, SiBN. In an embodiment the nitride may be deposited onto a silicon substrate and then placed into the crucible 105 so that it will mix with the other raw materials to form the semiconductor melt 107. The nitride may be added so that the semiconductor melt 107 has a nitrogen concentration of between about 1E10 atoms/cm$^3$ and about 1E19 atoms/cm$^3$, such as about 1E13 atoms/cm$^3$.

Alternatively, in an embodiment in which the vacancy enhancing material is nitrogen, the vacancy enhancing material may be added to the ambient environment during the pulling of the semiconductor ingot 101. For example, as the semiconductor ingot 101 is being pulled from the semiconductor melt 107, nitrogen may be introduced into the ambient environment at a flow rate of between about 1 slm and about 100 slm, such as about 10 slm.

Once the raw materials have been placed within the crucible 105, the heating elements 109 may increase the temperature of the crucible 105 and the raw materials beyond the raw materials' melting point. In an embodiment in which the raw materials include polycrystalline silicon, the heating elements 109 may increase the temperature above the melting point of silicon, such as greater than about 1,421° C., although any suitable temperature greater than the melting point of the raw materials may alternatively be utilized. Once the temperature has been raised, the raw materials are allowed to melt and mix in the crucible in order to form the semiconductor melt 107 and the heating elements 109 may be utilized to stabilize the temperature of the semiconductor melt 107.

After the raw materials have been melted and mixed to form the semiconductor melt 107, the seed crystal 115 may be placed into the seed holder 119 of the pulling device 111. The seed crystal 115 will be used as a nucleation point for the growth of the semiconductor ingot 101. In an embodiment the seed crystal 115 may be about 5 mm in diameter, and may be between about 100 mm and 300 mm in length, although the dimensions of the seed crystal 115 are not limited to these dimensions and may vary as desired for the process.

After the seed crystal 115 has been placed into the seed holder 119, the pulling device 111 may lower the seed crystal 115 into the semiconductor melt 107 to initiate the growth of the semiconductor ingot 101. Once in contact with the semiconductor melt 107, the pulling device 111 may reverse direction and begin pulling the seed crystal 115 from the semiconductor melt 107. In general, as the pulling device 111 pulls the seed crystal 115 from the semiconductor melt 107, the material of the semiconductor melt 107 will cool and solidify at an interface between the seed crystal 115 and the semiconductor melt 107, thereby solidifying into the semiconductor ingot 101 while crystallizing with the crystalline structure of the seed crystal 115.

In particular, the pulling device 111 may begin to pull the semiconductor ingot 101 from the semiconductor melt 107 by initially pulling the seed crystal 115 from the semiconductor melt 107 at an initial first speed in order to form a thin neck 121. This thin neck 121 may be utilized to counter-act and balance the stresses caused by immersing the relatively cool seed crystal 115 into the high temperature semiconductor melt 107, which may cause stresses that could cause macroscopic dislocations. However, by pulling the seed crystal 115 to form the thin neck 121, such dislocations may be driven to the surface of the thin neck 121, and the dislocations may be prevented from propagating into the remainder of the semiconductor ingot 101.

Once the thin neck 121 has been formed, the pull rate of the pulling device 111 may be reduced while the process temperature of the semiconductor melt 107 may be reduced to form the remainder of the semiconductor ingot 101 at a desired diameter. For example, the pull rate of the pulling device 111 may be reduced from below the first pull rate and the process temperature of the semiconductor melt 107 may be modified to be around 1400° C., although the precise process conditions may be varied as desired for a desired size and shape of the semiconductor ingot 101. The semiconductor ingot 101 may be continuously grown as it is being pulled until either the process conditions are modified or else the semiconductor melt 107 has been exhausted without being replenished.

However, while the semiconductor ingot 101 is being grown, the vacancy enhancing material (e.g., nitrogen) is also being incorporated into the crystalline structure of the semiconductor ingot 101. The incorporation of the vacancy enhancing material will cause the formation of a high concentration of vacancies within and throughout the semiconductor ingot 101. As described above, the vacancy concentration of the semiconductor ingot 101 may be between about 1E10 #/cm$^3$ and about 1E15 #/cm$^3$, such as about 1E11 #/cm$^3$. These vacancies may be utilized during the further processing of the semiconductor ingot 101 to help strengthen the material (as described below with respect to FIGS. 3A-3B).

As one of ordinary skill in the art will recognize, the Czochralski crystal growth process described above is merely one method of forming semiconductor crystals that include the vacancy enhancing material. Rather, the above description is intended as merely one illustrative embodiment, as any suitable method for incorporating the vacancy enhancing material into a semiconductor ingot may be utilized. All suitable methods for growing the semiconductor ingot 101 and incorporating the vacancy enhancing material into the semiconductor ingot 101 are fully intended to be included within the scope of the embodiments.

As merely one other example, if the semiconductor ingot 101 is formed utilizing a chemical vapor deposition (CVD) process with precursors such as $SiH_4$, $Si_2H_6$, and $Si_3H_8$ utilized to form the semiconductor material, then the vacancy enhancing material may be introduced as another gaseous precursor containing the vacancy enhancing material. For example, in an embodiment in which nitrogen is the vacancy enhancing material, gaseous ammonia ($NH_3$) or nitrogen ($N_2$) may be introduced as another precursor into the CVD process, thereby incorporating the nitrogen with a radial distribution within the semiconductor ingot 101 as the semiconductor ingot is being grown (as opposed to an axial distribution when the Czochralski process is utilized). In an embodiment in which ammonia is utilized, the ammonia may be introduced at a flow rate of between about 1 slm and about 100 slm, such as about 10 slm, while the semiconductor precursor $SiH_4$ may be introduced at a flow rate of between about 1 slm and about 100 slm, such as about 10 slm, and the other semiconductor precursor $Si_2H_6$ may be introduced at a flow rate of between about 1 slm and about 100 slm, such as about 10 slm.

Figure 2:
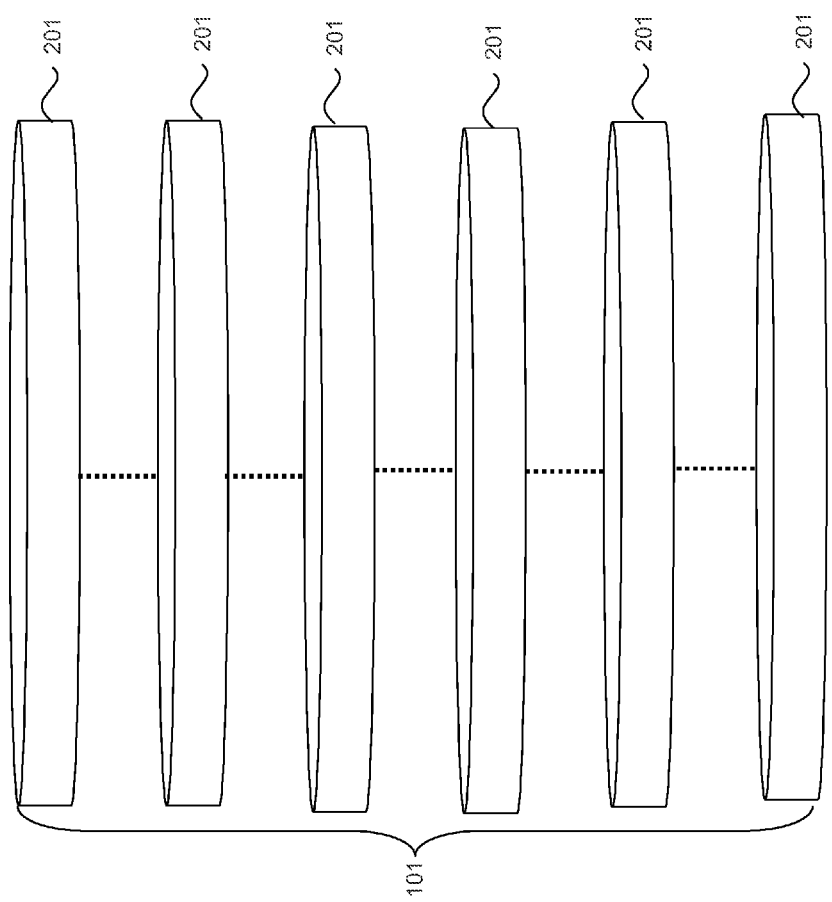
FIG. 2 illustrates a separation of the semiconductor ingot into semiconductor wafers in accordance with an embodiment.

FIG. 2 illustrates that, once the formation of the semiconductor ingot 101 has been completed, the semiconductor ingot 101 may be sliced into a plurality of individual semiconductor wafers 201 while also removing the thin neck 121 and any trailing remnants of the semiconductor ingot 101. Prior to the slicing of the semiconductor ingot 101, tests may be performed on the semiconductor ingot 101 to test such properties as its resistivity, impurity content, crystal perfection, or the like. If the semiconductor ingot 101 passes these tests, the semiconductor ingot 101 may be separated into individual semiconductor wafers 201 using, for example, wires coated with a slurry (not individually illustrated in FIG. 2) to cut through the semiconductor ingot 101, although any other suitable separation method, such as cutting the semiconductor ingot 101 with a diamond coated saw, may alternatively be utilized. Once separated, further processes, such as edge grinding, lapping, etching, and polishing, combinations of these, or the like, may be performed on the individual semiconductor wafers 201 in preparation for further processing.

Figure 3A:
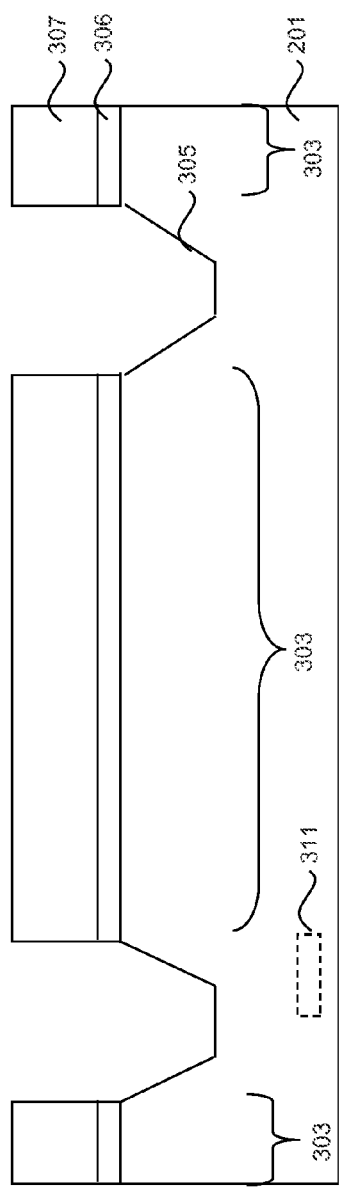
FIGS. 3A-3B illustrate a formation of trenches in the semiconductor wafers in accordance with an embodiment.
Figure 3B:
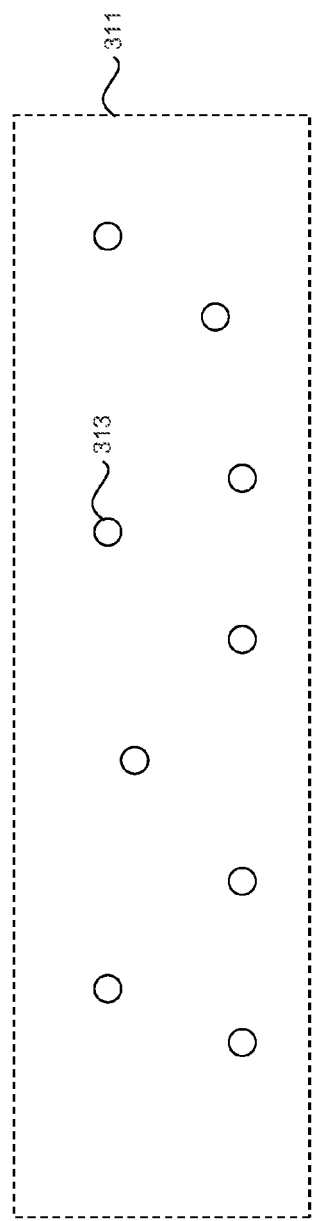

FIGS. 3A-3B illustrate the initiation of a formation of semiconductor devices such as transistor 600 (not illustrated in FIG. 3A but illustrated and discussed further below with respect to FIG. 6) on one of the semiconductor wafers 201. In an embodiment the process may be initiated by forming active areas 303 surrounded by trenches 305 within the semiconductor wafers 201. The active areas 303 are areas of the semiconductor wafer 201 adjacent to a top surface of the semiconductor wafer 201 into which dopants either have already been placed (e.g., by incorporating the dopants into the semiconductor melt 107 as discussed above with respect to FIG. 1) or else into which dopants may be implanted in order to make the active areas 303 conductive. The active areas 303 may be separated from each other by the trenches 305 in order to help isolate the active areas 303.

To form the trenches 305, a buffer layer 306 may optionally be formed over the semiconductor wafer 201 and may be used to provide a buffer between the semiconductor wafer 201 and a masking layer 307. The buffer layer 306 may be a buffering material, such as an oxide like silicon oxide, although any suitable buffering material may be utilized. The buffer layer 306 may be formed through a thermal oxidation of the semiconductor wafer 201 although any suitable process for forming the buffer layer 306 may be utilized. The buffer layer 306 may be formed to a thickness of between about 50 Å and about 200 Å, such as about 100 Å.

The masking layer 307 may be formed and patterned over the buffer layer 306 and the semiconductor wafer 201 to protect the active areas 303 while exposing portions of the semiconductor wafer 201 to assist in the formation of the trenches 305. The masking layer 307 may be formed by depositing a hardmask layer comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may alternatively be utilized. Once formed, the masking layer 307 is patterned through a suitable photolithographic process to expose those portions of the semiconductor wafer 201 as illustrated in FIG. 1.

As one of skill in the art will recognize, however, the processes and materials described above to form the masking layer 307 are not the only method that may be used to protect the active areas 303 while exposing portions of the semiconductor wafer 201 for the formation of the trenches 305. Any suitable process, such as a patterned and developed photoresist, may alternatively be utilized to protect the active areas 303 of the semiconductor wafer 201 while exposing portions of the semiconductor wafer 201 to be removed to form the trenches 305. All such methods are fully intended to be included in the scope of the present invention.

Once the masking layer 307 has been formed and patterned, the trenches 305 may be formed in the semiconductor wafer 201. The exposed semiconductor wafer 201 may be removed through a suitable process such as reactive ion etching (RIE) in order to form the trenches 305 in the semiconductor wafer 201, although other suitable processes may alternatively be used. The trenches 305 may be formed to be between about 2,400 Å and about 5,000 Å in depth from the surface of the semiconductor wafer 201, such as about 3,000 Å, and may have an aspect ratio of between about 1 and about 10, such as about 6.

FIG. 3B illustrates a simplified close-up view of the semiconductor wafer 201 in dashed box 311 in FIG. 3A. In this close-up view, a number of vacancies 313 may be seen located within the semiconductor wafer 201 prior to any thermal processing that has been performed on the semiconductor wafer 201. These vacancies 313 may have the concentration and distribution that were enhanced by the introduction of the vacancy enhancing material as discussed above with respect to FIG. 3A.

FIG. 4A illustrates a filling and overfilling of the trenches 305 with a dielectric material 401. In an embodiment the dielectric material 401 may be an oxide material, a high-density plasma (HDP) oxide, high density undoped silicate glass (HTUSG), combinations of these, or the like. The dielectric material 401 may be formed using either a chemical vapor deposition (CVD) method, such as the HARP process, a high density plasma CVD method, atmospheric pressure CVD (APCVD), plasma enhanced CVD (PECVD), or other suitable method of formation as is known in the art. The trenches 305 may be filled by overfilling the trenches 305 and the masking layer 307 with the dielectric material 401. The dielectric material 401 may be formed to a thickness of between about 4000 Å and about 8000 Å, such as about 6600 Å, over the surface of the trenches 305.

FIG. 4A also illustrates a first anneal process (represented in FIG. 4 by the lines 403) that may be performed on the dielectric material 401. The first anneal process 403 may comprise a series of independent thermal processes that, collectively, may be used to densify the dielectric material 401 and also to form bulk micro defects (BMDs) 405 (not illustrated in FIG. 4A but illustrated and discussed below with respect to FIG. 4B). In an embodiment the first anneal process 403 may comprise an initializing step, a first growth step, a ramping step, and a second growth step.

In an embodiment, the initializing step is utilized to increase the temperature from ambient to between about 700° C. and about 1000° C. in order to initialize the formation of BMDs 405 in the semiconductor wafer 201. The increase in temperature may be performed at a rate of between about 15° C./min and about 1000° C./min until the desired temperature is reached. During this step the semiconductor wafer 201 may be kept in an ambient of hydrogen, helium, argon, combinations of these, or the like.

Once the initializing step has been completed, the first growth step is performed in order to grow the BMDs that were initialized in the initializing step. During the first growth step, the semiconductor wafer 201 may be kept in the environment comprising an ambient of hydrogen, helium, argon, combinations or these, or the like, while the temperature is kept within a range of between about 850° C. and about 980° C., for a time of between about 0.5 minutes and about 60 minutes. By keeping the heat constant for this time, the growth of the BMDs 405 can be stably controlled.

Once the first growth step has been completed, the ramping step may be used to increase the temperature from the first growth step to a temperature between about 1000° C. and about 1300° C. This increase may be performed at a rate of between about 0.5° C./min and about 5° C./min until the desired temperature has been obtained. During the ramping step the semiconductor wafer 201 may be kept in an ambient environment of hydrogen, helium, argon, combinations of these, or the like.

Once the ramping step has increased the temperature for the first annealing process 403, the second growth step may be performed to promote stable growth of the BMDs 405 within the semiconductor wafer 201. In an embodiment, the second growth step may be performed at a temperature of between about 1100° C. and about 1300° C. in an ambient environment of hydrogen, helium, argon, combinations of these, or the like. The second growth step may be performed for greater than about 5 minutes.

Alternatively, the first anneal process 403 may be, e.g., a single step thermal anneal performed in a furnace, or may be any other suitable thermal process, such as a flash anneal, a laser anneal, a rapid thermal anneal, combinations of these, or the like. In an embodiment in which the first anneal process 403 is a single step thermal anneal, the first anneal process 403 may be performed at a temperature of between about 150° C. and about 1150° C., such as about 1100° C., for a time period of between about 2 hours and about 48 hours, such as about 17 hours.

FIG. 4B illustrates in an enlarged view the formation of bulk micro defects (BMDs) 405 within the semiconductor wafer 201 during the first anneal process 403. In particular, as the first anneal process 403 is occurring interstitial oxygen within the semiconductor wafer 201 (which may have a concentration of between about 1E17 atoms/cm$^3$ and about 1E19 atoms/cm$^3$, such as about 1.5E18 atoms/cm$^3$) will enter the vacancies 313 (see FIG. 3B) within the semiconductor wafer 201 and generate the BMDs 405 within the semiconductor wafer 201. The chemical equation for this process may follow Equation 1.

$$Si + 2O + \alpha V_o = SiO_2 + \beta I \qquad \text{Eq. 1}$$

Where: V=Vacancies
I=Interstitial Si
α=Correction Factor for the Number of Vacancies
β=Correction Factor for the Number of Interstitial Si As the interstitial oxygen generates the BMDs 405 where the vacancies 313 are located, the BMDs 405 will have a similar concentration as the vacancies 313 had in the semiconductor wafer 201. For example, the BMDs 405 may have a concentration of between about 1E9 #/cm$^3$ and about 1E12 #/cm$^3$, such as about 5E9 #/cm$^3$ throughout the semiconductor wafer 201 (as measured by MO4). Additionally, with the relatively large concentration of BMDs 405 and the incorporation of the vacancy enhancing material, the size of the BMDs 405 will be better controlled so that the BMDs 405 themselves do not generate uncontrollable problems.

Additionally, during an annealing process such as the first anneal process 403, the semiconductor wafer 201 may expand, contract, and/or flow as the heat from the annealing process flows into and out of the semiconductor wafer 201. These expansions, contractions, and flows may work to generate different stresses at different points within the semiconductor wafer 201. These stresses may normally partially deform the semiconductor wafer 201 into a new shape as the semiconductor wafer 201 is being annealed, known as an overlay fingerprint. This overlay fingerprint can cause wafer to wafer (W2W) and lot to lot (L2L) variations that are undesirable.

However, with the addition of the high density but tiny BMDs 405 that are generated within the semiconductor wafer 201, this overlay fingerprint may be reduced or eliminated. In particular, the BMDs 405 that are formed within the semiconductor wafer 201 will act as an aggregate within the semiconductor wafer 201. As such, the BMDs 405 will reinforce the semiconductor wafer 201 against the stresses that may occur during the first anneal process 403 and other subsequent high temperature processes. This reinforcement will help to reduce or eliminate the overlay fingerprint caused by the first anneal process 403 and other high temperature thermal processes.

FIG. 5 illustrates the removal of excess dielectric material 401 located outside of the trenches 305 after the first anneal process 403 to form isolation trenches 501. In an embodiment the excess dielectric material 401 may be removed using a planarization process such as, e.g., a chemical mechanical polishing (CMP) process in which etchants and abrasives are utilized to chemically and mechanically grind the excess dielectric material 401 until the dielectric material 401 is planar with the semiconductor wafer 201. Additionally, as the CMP process is planarizing the dielectric material 401 with the semiconductor wafer 201, the buffer layer 306 and the masking layer 307 may also be removed from the surface of the semiconductor wafer 201, thereby exposing the active areas 303 for further processing.

After the removal of the excess dielectric material 401, the semiconductor wafer 201 may be returned to the furnace (or alternatively be placed into a different furnace) so that the isolation trenches 501 may again be annealed in a second anneal (represented in FIG. 5 by the lines 503) in order to densify the isolation trenches 501. In an embodiment the second anneal 503 may be performed at a temperature of between about 150° C. and about 1150° C., such as about 1100° C., for a time of between about 2 hours and about 48 hours, such as about 17 hours.

However, as the BMDs 405 (see FIG. 4B) are located throughout the semiconductor wafer 201 and help to strengthen and support the semiconductor wafer 201, the semiconductor wafer 201 is better suited to withstand the stresses that arise during the second anneal 503. In particular, the BMDs 405 serve to physically strengthen the semiconductor wafer 201 from the stresses that would normally cause a fingerprint overlay to form during the second anneal 503. However, the presence of the BMDs 405 help to reduce or eliminate the fingerprint overlay that would otherwise have formed.

Figure 6:
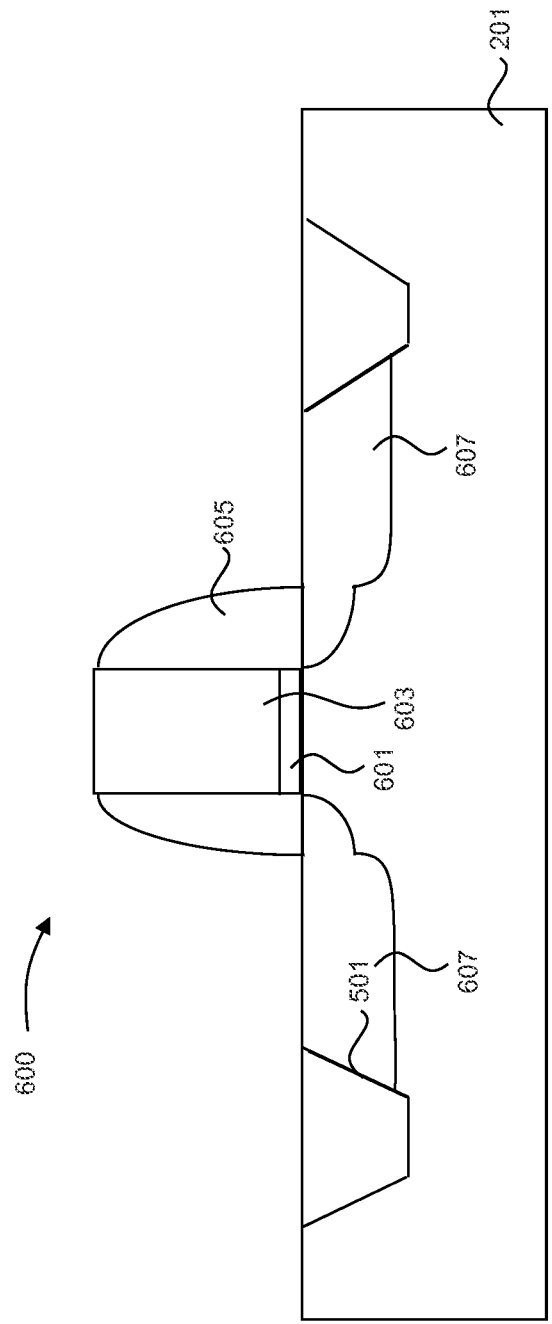
FIG. 6 illustrates a formation of an active device on the semiconductor wafer in accordance with an embodiment.

FIG. 6 illustrates the formation of a transistor 600 with a gate dielectric 601, a gate electrode 603, and spacers 605 over the semiconductor wafer 201. The gate dielectric 601 may be a dielectric material, such as silicon oxide, silicon oxynitride, silicon nitride, an oxide, a nitrogen-containing oxide, a combination thereof, or the like. The gate dielectric 601 may have a relative permittivity value greater than about 4. Other examples of such materials include aluminum oxide, lanthanum oxide, hafnium oxide, zirconium oxide, hafnium oxynitride, or combinations thereof.

In an embodiment in which the gate dielectric 601 comprises an oxide layer, the gate dielectric 601 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the gate dielectric 601 may be between about 8 Å to about 200 Å in thickness.

The gate electrode 603 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like. In an embodiment in which the gate electrode 603 is poly-silicon, the gate electrode 603 may be formed by depositing doped or undoped poly-silicon by low-pressure chemical vapor deposition (LPCVD) to a thickness in the range of about 400 Å to about 2,400 Å, such as about 1,400 Å.

Once the gate dielectric 601 and the gate electrode 603 have been formed, the gate dielectric 601 and gate electrode 603 may be patterned. In an embodiment, the gate dielectric 601 and the gate electrode 603 may be patterned using, e.g., a photolithographic masking and etching process, whereby a photolithographic mask (not shown in FIG. 6) is formed over the gate electrode 603 and then exposed to a patterned light. After exposure, desired portions of the photolithographic mask are removed to expose the underlying gate electrode 603, which may then be etched to remove the exposed portions, thereby patterning the gate electrode 603 and the gate dielectric 601.

The spacers 605 may be formed by blanket depositing one or more spacer layers (not shown) over the gate electrode 603 and the semiconductor wafer 201. The spacer layers may comprise SiN, oxynitride, SiC, SiON, oxide, and the like and may be formed by commonly used methods such as chemical vapor deposition (CVD), plasma enhanced CVD (PECVD), sputter, and other methods known in the art. The spacer layers may be patterned, such as by isotropically or anisotropically etching, thereby removing the spacer layers from the horizontal surfaces of the structure and forming the spacers 605 as illustrated in FIG. 6.

However, as one of ordinary skill in the art will recognize, the process described above and the resulting shape of the spacers 605 as illustrated in FIG. 6 are intended to be merely illustrative and are not intended to limit the embodiments to these descriptions. Rather, any suitable number and combination of spacer layers and shapes may be utilized in order to form the spacers 605 for the gate dielectric 601 and the gate electrode 603, and any suitable combination of spacers may alternatively be utilized.

Source/drain regions 607 may be formed in the semiconductor wafer 201 on opposing sides of the gate dielectric 601. In an embodiment in which the semiconductor wafer 201 is an n-type substrate, the source/drain regions 607 may be formed by implanting appropriate p-type dopants such as boron, gallium, indium, or the like. Alternatively, in an embodiment in which the semiconductor wafer 201 is a p-type substrate, the source/drain regions 607 may be formed by implanting appropriate n-type dopants such as phosphorous, arsenic, or the like. These source/drain regions 607 may be implanted using the gate dielectric 601, gate electrode 603, and the spacers 605 as masks.

It should be noted that one of ordinary skill in the art will realize that many other processes, steps, or the like may be used to form these source/drain regions 607. For example, one of ordinary skill in the art will realize that a plurality of implants may be performed using various combinations of spacers and liners to form the source/drain regions 607 to have a specific shape or characteristic suitable for a particular purpose. Any of these processes may be used to form the source/drain regions 607, and the above description is not meant to limit the embodiments to the steps presented above.

After the transistor 600 and any other active or passive devices are formed on the semiconductor wafer 201, further processing may be performed to manufacture a plurality of semiconductor dies (not individually illustrated apart from the semiconductor wafer 201 in FIG. 6). For example, layers of conductive material and dielectric material may be formed over the active and passive devices in order to interconnect the devices and form desired circuitry, contacts may be formed to connect the desired circuitry to external devices (not shown), and passivation layers may be formed to cover and protect the circuitry. Once completed, individual semiconductor dies may be singulated from the semiconductor wafer 201 by cutting or etching the semiconductor wafer 201 between individual semiconductor dies so that the semiconductor dies may be removed from the semiconductor wafer 201.

In accordance with an embodiment, a method for manufacturing a semiconductor device, the method comprising combining a semiconductor raw material and a vacancy enhancing raw material to form a combined raw material mixture, is provided. The raw material mixture is crystallized into a semiconductor ingot.

In accordance with another embodiment, a method of manufacturing a semiconductor device comprising providing a semiconductor raw material and introducing a vacancy enhancing raw material into the semiconductor raw material, the vacancy enhancing raw material comprising a vacancy enhancing material, is provided. The semiconductor raw material and the vacancy enhancing material are crystallized into a semiconductor ingot, wherein the semiconductor ingot comprises a first set of vacancies. A semiconductor wafer is separated from the semiconductor ingot, the semiconductor wafer comprising the first set of vacancies, and the first set of vacancies is transformed into bulk micro defects using at least in part a thermal process.

In accordance with yet another embodiment, a method of manufacturing a semiconductor device comprising placing a semiconductor raw material into a crucible and introducing nitrogen into the crucible is provided. The semiconductor raw material and the nitrogen are mixed to form a semiconductor melt, and a semiconductor ingot is pulled from the semiconductor melt, the semiconductor ingot comprising the nitrogen.

Although the present embodiments and their advantages have been described in detail, it should be understood that various changes, substitutions and alterations can be made herein without departing from the spirit and scope of the disclosure as defined by the appended claims. For example, the precise method of manufacturing the semiconductor ingot may be modified while still remaining within the scope of the embodiments. Additionally, the precise materials and methods for introducing the vacancy enhancing material may also be modified.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
   providing a semiconductor raw material;
   introducing a vacancy enhancing raw material into the semiconductor raw material, wherein the introducing the vacancy enhancing raw material is introduced at least in part through an ambient environment at a flow rate of between about 1 slm and about 100 slm, wherein the introducing the vacancy enhancing raw material introduces a concentration of vacancy enhancing raw material within the semiconductor raw material of between about 1E10 atom/cm$^3$ and about 1E19 atoms/cm$^3$;
   crystallizing the semiconductor raw material and the vacancy enhancing material into a semiconductor ingot, wherein the semiconductor ingot comprises a first set of vacancies and has an interstitial oxygen concentration greater than $1.5 \times 10^{18}$ atoms/cm$^3$ and less than $1 \times 10^{19}$ atoms/cm$^3$;
   separating a semiconductor wafer from the semiconductor ingot, the semiconductor wafer comprising the first set of vacancies;
   forming a trench within the semiconductor wafer;
   filling the trench with a dielectric;
   annealing the dielectric within the trench and transforming the first set of vacancies into bulk micro defects using at least in part a thermal process, wherein the thermal process is performed between 1100° C. and 1150° C. for a time period of between 2 hours and 17 hours;
   prior to the annealing the dielectric, increasing a temperature from ambient to between about 700° C. and about 1000° C. at a rate of between about 15° C./min and about 1000° C./min;
   after the increasing the temperature holding the temperature within a range of between about 850° C. and about 980° C. for a time of between about 0.5 minutes and about 60 minutes; and
   after the holding the temperature, increasing the temperature to greater than 1100° C. and less than 1300° C. at a rate of between about 0.5° C./min and about 5° C./min.

2. The method of claim 1, further comprising planarizing the dielectric.

3. The method of claim 1, wherein the vacancy enhancing raw material is a nitrogen gas.

4. A method of manufacturing a semiconductor device, the method comprising:
   placing a semiconductor raw material into a crucible;
   introducing nitrogen into the crucible, wherein the nitrogen is introduced as silicon oxynitride or silicon boron nitride;
   mixing the semiconductor raw material and the nitrogen to form a semiconductor melt with a nitrogen concentration of greater than about $1 \times 10^{10}$ atoms/cm$^3$ and less than $1 \times 10^{13}$ atoms/cm$^3$;
   pulling a semiconductor ingot from the semiconductor melt, the semiconductor ingot comprising the nitrogen and having an interstitial oxygen concentration greater than $1.5 \times 10^{18}$ atoms/cm$^3$ and less than $1 \times 10^{19}$ atoms/cm$^3$;
   separating the semiconductor ingot into semiconductor wafers;
   forming trenches within at least one of the semiconductor wafers;
   forming a dielectric material within the trenches of the at least one of the semiconductor wafers;
   annealing both the dielectric material and the at least one of the semiconductor wafers to generate bulk micro defects in the at least one of the semiconductor wafers, wherein the annealing process is performed for a time of greater than five minutes at a temperature of greater than 1100° C. and less than 1300° C.;

prior to the annealing both the dielectric material and the at least one of the semiconductor wafers, increasing a temperature from ambient to between about 700° C. and about 1000° C. at a rate of between about 15° C./min and about 1000° C./min;

after the increasing the temperature holding the temperature within a range of between about 85° C. and about 980° C. for a time of between about 0.5 minutes and about 60 minutes; and after the holding the temperature, increasing the temperature to greater than 1100° C. and less than 1300° C. at a rate of between about 0.5° C./min and about 5° C./min.

5. The method of claim 4, further comprising annealing the at least one of the semiconductor wafers and the dielectric material a second time.

6. The method of claim 5, further comprising grinding the dielectric material prior to the annealing the at least one of the semiconductor wafers and the dielectric material the second time.

7. The method of claim 4, wherein the semiconductor ingot has a vacancy concentration of greater than about $1\times10^{10}\#/cm^3$ and less than about $1\times10^{15}\#/cm^3$.

* * * * *

UNITED STATES PATENT AND TRADEMARK OFFICE
CERTIFICATE OF CORRECTION

PATENT NO. : 9,945,048 B2
APPLICATION NO. : 13/525041
DATED : April 17, 2018
INVENTOR(S) : Syue et al.

It is certified that error appears in the above-identified patent and that said Letters Patent is hereby corrected as shown below:

In the Claims

In Column 13, Line 7, Claim 4, delete "85° C." and insert --850° C.--.

Signed and Sealed this
Seventh Day of August, 2018

Andrei Iancu
*Director of the United States Patent and Trademark Office*